United States Patent
Chen et al.

(10) Patent No.: US 7,489,542 B2
(45) Date of Patent: **\*Feb. 10, 2009**

(54) SYSTEMS FOR VARIABLE READING IN NON-VOLATILE MEMORY

(75) Inventors: Jian Chen, San Jose, CA (US); Chi-Ming Wang, Fremont, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/770,466

(22) Filed: Jun. 28, 2007

(65) Prior Publication Data

US 2007/0247916 A1    Oct. 25, 2007

Related U.S. Application Data

(63) Continuation of application No. 11/316,141, filed on Dec. 21, 2005, now Pat. No. 7,259,987, which is a continuation of application No. 10/818,597, filed on Apr. 6, 2004, now Pat. No. 7,020,017.

(51) Int. Cl.
*G11C 11/34* (2006.01)

(52) U.S. Cl. .......................... 365/185.03; 365/185.18; 365/185.14

(58) Field of Classification Search ............ 365/185.03, 365/185.18, 185.14, 185.33, 185.24, 185.22
See application file for complete search history.

(56) References Cited

U.S. PATENT DOCUMENTS

| 4,979,146 A * | 12/1990 | Yokoyama et al. ..... 365/185.14 |
| 5,532,962 A | 7/1996 | Auclair et al. |
| 5,539,690 A | 7/1996 | Talreja et al. |
| 5,657,332 A | 8/1997 | Auclair et al. |

(Continued)

FOREIGN PATENT DOCUMENTS

EP        01271553        1/2003

(Continued)

OTHER PUBLICATIONS

Notice of Allowance and Fee(s) Due, United States Patent & Trademark Office, U.S. Appl. No. 11/316,141, filed Dec. 21, 2005, Mar. 28, 2007.

(Continued)

*Primary Examiner*—Dang T Nguyen
(74) *Attorney, Agent, or Firm*—Vierra Magen Marcus & DeNiro LLP

(57) ABSTRACT

Systems and methods in accordance with various embodiments can provide for reduced program disturb in non-volatile semiconductor memory. In one embodiment, select memory cells such as those connected to a last word line of a NAND string are programmed using one or more program verify levels or voltages that are different than a corresponding level used to program other cells or word lines. One exemplary embodiment includes using a lower threshold voltage verify level for select physical states when programming the last word line to be programmed for a string during a program operation. Another embodiment includes applying a lower program voltage to program memory cells of the last word line to select physical states. Additional read levels are established for reading the states programmed using lower verify levels in some exemplary implementations. A second program voltage step size that is larger than a nominal step size is used in one embodiment when programming select memory cells or word lines, such as the last word line to be programmed for a NAND string.

19 Claims, 8 Drawing Sheets

U.S. PATENT DOCUMENTS

| | | | |
|---|---|---|---|
| 5,815,436 A * | 9/1998 | Tanaka et al. | 365/185.03 |
| 5,862,074 A | 1/1999 | Park | |
| 5,943,260 A | 8/1999 | Hirakawa | |
| 6,000,006 A | 12/1999 | Bruce et al. | |
| 6,044,019 A | 3/2000 | Cernea et al. | |
| 6,154,157 A | 11/2000 | Wong | |
| 6,160,739 A | 12/2000 | Wong | |
| 6,175,522 B1 | 1/2001 | Fang | |
| 6,181,599 B1 | 1/2001 | Gongwer | |
| 6,222,762 B1 | 4/2001 | Guterman et al. | |
| 6,272,040 B1 * | 8/2001 | Salter et al. | 365/158 |
| 6,285,593 B1 | 9/2001 | Wong | |
| 6,345,000 B1 | 2/2002 | Wong et al. | |
| 6,356,481 B1 * | 3/2002 | Micheloni et al. | 365/185.23 |
| 6,456,528 B1 | 9/2002 | Chen | |
| 6,462,988 B1 | 10/2002 | Harari | |
| 6,476,753 B1 * | 11/2002 | Hansen et al. | 341/155 |
| 6,504,762 B1 | 1/2003 | Harari | |
| 6,522,580 B2 | 2/2003 | Chen et al. | |
| 6,532,556 B1 | 3/2003 | Wong et al. | |
| 6,542,407 B1 | 4/2003 | Chen et al. | |
| 6,567,302 B2 * | 5/2003 | Lakhani | 365/185.03 |
| 6,570,785 B1 | 5/2003 | Mangan et al. | |
| 6,570,790 B1 | 5/2003 | Harari | |
| 6,643,188 B2 | 11/2003 | Tanaka et al. | |
| 6,717,847 B2 | 4/2004 | Chen | |
| 6,717,851 B2 | 4/2004 | Mangan et al. | |
| 6,760,068 B2 | 7/2004 | Pteropoulos et al. | |
| 6,771,536 B2 | 8/2004 | Li et al. | |
| 6,778,442 B1 | 8/2004 | Hamilton | |
| 6,781,877 B2 | 8/2004 | Cernea et al. | |
| 6,888,758 B1 | 5/2005 | Hemink et al. | |
| 7,020,017 B2 | 3/2006 | Chen et al. | |
| 7,173,859 B2 | 2/2007 | Hemink | |
| 7,259,987 B2 | 8/2007 | Chen et al. | |
| 2002/0051383 A1 | 5/2002 | Mangan et al. | |
| 2003/0112663 A1 | 6/2003 | Quadar et al. | |
| 2003/0128586 A1 | 7/2003 | Chen et al. | |
| 2003/0137888 A1 | 7/2003 | Chen et al. | |
| 2003/0218920 A1 | 11/2003 | Harari | |
| 2004/0012998 A1 | 1/2004 | Chien et al. | |
| 2004/0027865 A1 | 2/2004 | Mangan et al. | |
| 2004/0042270 A1 | 3/2004 | Huang et al. | |
| 2004/0047182 A1 | 3/2004 | Cernea et al. | |
| 2004/0079988 A1 | 4/2004 | Harari | |
| 2004/0156241 A1 | 8/2004 | Mokhlesi et al. | |
| 2004/0179404 A1 | 9/2004 | Quadar et al. | |
| 2004/0190337 A1 | 9/2004 | Chen | |
| 2006/0098483 A1 | 5/2006 | Chen et al. | |

OTHER PUBLICATIONS

Allowed Claims, U.S. Appl. No. 11/316,141, filed Dec. 21, 2005.

International Search Report & The Written Opinion of the International Searching Authority, Patent Cooperation Treaty, Application No. PCT/US2005/010006 entitled, "Variable Programming of Non-Volatile Memory," Aug. 1, 2005.

Office Action, Non-Final, United States Patent & Trademark Office, U.S. Appl. No. 10/818,597 entitled, "Variable Programming of Non-Volatile Memory," Apr. 18, 2005.

Notice of Allowance and Fee(s) Due, United States Patent & Trademark Office, U.S. Appl. No. 10/818,597 entitled, "Variable Programming of Non-Volatile Memory," Sep. 27, 2005.

Allowed Claims, U.S. Appl. No. 10/818,597 entitled, "Variable Programming on Non-Volatile Memory," Sep. 27, 2005.

Notice of Allowance and Fee(s) Due, United States Patent & Trademark Office, U.S. Appl. No. 11/316,141 entitled, "Systems for Variable Programming of Non-Volatile Memory," Mar. 28, 2007.

Allowed Claim, U.S. Appl. No. 11/316,141 entitled, "Systems for Variable Programming of Non-Volatile Memory," Mar. 28, 2007.

Non-Final Office Action, United States Patent & Trademark Office, U.S. Appl. No. 11/315,817, filed Dec. 21, 2005, Nov. 29, 2007.

Response to Non-Final Office Action, U.S. Appl. No. 11/315,817, filed Dec. 21, 2005, Apr. 29, 2008.

Non-Final Office Action, United States Patent & Trademark Office, U.S. Appl. No. 11/315,817, filed Dec. 21, 2005, Aug. 4, 2008.

Response to Non-Final Office Action, U.S. Appl. No. 11/315,817, filed Dec. 21, 2005, Sep. 26, 2008.

* cited by examiner

SYSTEMS FOR VARIABLE READING IN NON-VOLATILE MEMORY

CLAIM OF PRIORITY

This application is a continuation application of U.S. patent application Ser. No. 11/316,141, now U.S. Pat. No. 7,259,987, entitled "SYSTEMS FOR VARIABLE PROGRAMMING OF NON-VOLATILE MEMORY," filed Dec. 21, 2005, which is a continuation application of U.S. patent application Ser. No. 10/818,597, now U.S. Pat. No. 7,020,017, entitled "VARIABLE PROGRAMMING OF NON-VOLATILE MEMORY," filed Apr. 6, 2004, both of which are incorporated herein by reference in their entirety.

BACKGROUND OF THE INVENTION

1. Field of the Invention

The present invention relates generally to technology for programming non-volatile memory devices.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first select gate 120 and a second select gate 122. Select gate 120 connects the NAND string to bit line 126. Select gate 122 connects the NAND string to source line 128. Select gate 120 is controlled by applying appropriate voltages to control gate 120CG for select gate 120. Select gate 122 is controlled by applying the appropriate voltages to control gate 122CG of select gate 122. Each of the transistors 100, 102, 104 and 106 includes a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

FIG. 3 provides a cross-sectional view of the NAND string described above. As depicted in FIG. 3, the transistors (also called cells or memory cells) of the NAND string are formed in p-well region 140. Each transistor includes a stacked gate structure that consists of the control gate (100CG, 102CG, 104CG and 106CG) and a floating gate (100FG, 102FG, 104FG and 106FG). The floating gates are formed on the surface of the p-well on top of an oxide film. The control gate is above the floating gate, with an oxide layer separating the control gate and floating gate. Note that FIG. 3 appears to depict a control gate and floating gate for transistors 120 and 122. However, for transistors 120 and 122, the control gate and the floating gate are connected together. The control gates of the memory cells (100, 102, 104, 106) form the word lines. N+ diffused layers 130, 132, 134, 136 and 138 are shared between neighboring cells whereby the cells are connected to one another in series to form a NAND string. These N+ diffused layers form the source and drain of each of the cells. For example, N+ diffused layer 130 serves as the drain of transistor 122 and the source for transistor of 106, N+ diffused layer 132 serves as the drain for transistor 106 and the source for transistor 104, N+ diffused region 134 serves as the drain for transistor 104 and the source for transistor 102, N+ diffused region 136 serves as the drain for transistor 102 and the source for transistor 100, and N+ diffused layer 138 serves as the drain for transistor 100 and the source for transistor 120. N+ diffused layer 126 connects to the bit line for the NAND string, while N+ diffused layer 128 connects to a common source line for multiple NAND strings.

Note that although FIGS. 1-3 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string.

A typical architecture for a flash memory system using a NAND structure will include several NAND strings. For example, FIG. 4 shows three NAND strings 202, 204 and 206 of a memory array having many more NAND strings. Each of the NAND strings of FIG. 4 includes two select transistors and four memory cells. For example, NAND string 202 includes select transistors 220 and 230, and memory cells 220, 224, 226 and 228. NAND string 204 includes select transistors 240 and 250, and memory cells 242, 244, 246 and 248. Each string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224 and memory cell 244. Word line WL1 is connected to the control gates for memory cell 226 and memory cell 246. Word line WL0 is connected to the control gates for memory cell 228 and memory cell 248. As can be seen, each bit line and the respective NAND string comprise the columns of the array of memory cells. The word lines (WL3, WL2, WL1 and WL0) comprise the rows of the array. Each word line connects the control gates of each memory cell in the row. For example, word line WL2 is connected to the control gates for memory cells 224, 244 and 252.

Each memory cell can store data (analog or digital). When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0." When the threshold voltage is negative and a read is attempted by applying 0 volts to the control gate, the memory cell will turn on to indicate logic one is being stored. When the threshold voltage is positive and a read is attempted by applying 0 volts to the control gate, the memory cell will not turn on, which indicates that logic zero is stored.

A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges assigned to the data values "11", "10", "01", and "00." In one example of a NAND type memory, the threshold voltage after an erase operation is negative and defined as "11". Positive threshold voltages are used for the states of "10", "01", and "00."

Relevant examples of NAND type flash memories and their operation are provided in the following U.S. Patents/Patent Applications, all of which are incorporated herein by reference: U.S. Pat. No. 5,570,315; U.S. Pat. No. 5,774,397, U.S. Pat. No. 6,046,935, U.S. Pat. No. 6,456,528 and U.S. patent application. Ser. No. 09/893,277 (Publication No. US2003/0002348). Other types of flash memory devices can also be used in accordance with embodiments of the present invention. For example, the following patents describe NOR type flash memories and are incorporated herein by reference in their entirety: U.S. Pat. Nos. 5,095,344; 5,172,338; 5,890,192 and 6,151,248. Another example of a flash memory type is found in U.S. Pat. No. 6,151,248, incorporated herein by reference in its entirety.

When programming a flash memory cell, a program voltage is applied to the control gate and the bit line is grounded. Electrons from the p-well are injected into the floating gate. When electrons accumulate in the floating gate, the floating gate becomes negatively charged and the threshold voltage of the cell is raised. To apply the program voltage to the control gate of the cell being programmed, that program voltage is applied on the appropriate word line. As discussed above, that word line is also connected to one cell in each of the other NAND strings that utilize the same word line. For example, when programming cell 224 of FIG. 4, the program voltage will also be applied to the control gate of cell 244 because both cells share the same word line. A problem arises when it's desired to program one cell on a word line without programming other cells connected to the same word line, for example, when it's desired to program cell 224 and not cell 244. Because the program voltage is applied to all cells connected to a word line, an unselected cell (a cell that is not to be programmed) on the word line, especially a cell adjacent to the cell selected for programming may become inadvertently programmed. For example, cell 244 is adjacent in the row direction to cell 224. When programming cell 224, there is a concern that cell 244 might unintentionally be programmed. The unintentional programming of the unselected cell on the selected word line is referred to as "program disturb."

Several techniques have been employed to prevent program disturb. In one method known as "self boosting," the unselected bit lines are electrically isolated and a pass voltage (e.g. 10 volts) is applied to the unselected word lines during programming. The unselected word lines couple to the unselected bit lines, causing a voltage (e.g. eight volts) to exist in the channel of the unselected bit lines, which tends to reduce program disturb. Self boosting causes a voltage boost to exist in the channel which tends to lower the voltage across the tunnel oxide and hence reduce program disturb.

A NAND string is typically (but not always) programmed from the source side to the drain side, for example, from memory cell 228 to memory cell 222. When the programming process is ready to program the last (or near the last) memory cell of the NAND string, if all or most of the previously programmed cells on the string being inhibited (e.g. string 204) were programmed, then there is negative charge in the floating gates of the previously programmed cells. Because of this negative charge on the floating gates, the boosting potential doesn't get high enough and there still may be program disturb on the last few word lines. For example, when programming cell 222, if cells 248, 246 and 244 were programmed, then each of those transistors (244, 246, 248) have a negative charge on their floating gate which will limit the boosting level of the self boosting process and possibly allow program disturb on cell 242.

The problem discussed above with self boosting has been addressed by various schemes such as Local Self Boosting ("LSB") and Erased Area Self Boosting ("EASB"). An overview of various such schemes including an improved self-boosting technique can be found in U.S. patent application Ser. No. 10/379,608, entitled "Improved Self Boosting Technique", incorporated herein by reference in its entirety. While these schemes provide an improvement to reduce the occurrence of program disturb, they may not completely eliminate its occurrence and may introduce other problems that can lead to program disturb.

Accordingly, there is a need for a better mechanism to reduce or eliminate program disturb.

SUMMARY OF THE INVENTION

The present invention, roughly described, pertains to technology for programming, verifying programming, and reading non-volatile storage elements in a memory device. Systems and methods in accordance with various embodiments can utilize variable program target levels, verify levels, read levels, and step sizes when programming, verifying, and reading selected storage elements of a memory device. These systems and methods can provide for decreased program disturb and better data retention in a memory device by utilizing smaller program voltages to program select storage elements to target physical states. Increased step sizes can also be used to increase programming speed.

In one embodiment, at least two sets of verify or target levels are used when programming a memory system. The verify levels used when programming select word lines can be different than nominal verify levels used when programming other word lines. For example, the last word line of a group of storage elements or a word line near to the last word line of a group can be programmed using a second set of verify levels. The last word line can be a last word line to be programmed for the group during a program operation. The second set of verify levels can include second levels for each physical state to which a storage element may be programmed or second levels only for select physical states, such as the physical state corresponding to the highest threshold voltage range used to represent a state.

Memory cells connected to a last word line or to a word line near to a last word line can have tighter threshold distributions representing physical states than other memory cells. The second set of verify levels can take advantage of this and be selected such that the selected memory cells are programmed to lower threshold voltages to represent a physical state. Because of the tighter distributions, the threshold voltage ranges can be reduced while maintaining adequate separation between states. In this manner, the program voltage used to raise a memory cell to a selected state can be reduced. By using reduced program voltages, program disturb for the memory device can be reduced. Particularly, the program disturb experienced by storage elements connected to a last word line or near to a last word line in a group of storage elements can be reduced.

In one embodiment, a second set of read levels is also used. The second set of read levels can be selected to read memory cells having reduced threshold voltages distributions representing selected physical states.

One exemplary embodiment includes a method of programming non-volatile memory, comprising programming a first set of one or more non-volatile storage elements to a first physical state, and programming a second set of one or more non-volatile storage elements to the first physical state, wherein the first physical state includes a lower minimum voltage for the second set of one or more non-volatile storage elements than for the first set of one or more non-volatile storage elements.

Another exemplary embodiment includes a method of programming non-volatile memory, comprising programming a first set of one or more non-volatile storage elements to a first physical state using a first target level and programming a second set of one or more non-volatile storage elements to the first physical state using a second target level, wherein the second target level is below the first target level.

In another embodiment, a step size by which a program pulse is increased during a program operation is larger for select word lines, such as the last word line in a group. In this embodiment, a second set of verify levels need not be used, although it can. For groups of memory cells having tighter threshold distributions, the step size can be increased while still accurately programming storage elements within selected threshold voltage ranges. Because of tighter threshold voltage distributions, greater separation between the highest threshold voltage of one state and the lowest threshold voltage of a next state exists. The increased step size can lead to increased programming speed for the selected groups of elements and thus, increased programming speed for the overall memory device.

In one embodiment, a system in accordance with an embodiment of the present invention can include an array of storage elements and a managing circuit. The managing circuit can include dedicated hardware and/or can include hardware that is programmed by software stored on one or more storage devices such as non-volatile memory (e.g. flash memory, EEPROM, etc.) or other memory devices. In one embodiment, the managing circuit includes a controller and a state machine. In another embodiment, the managing circuit only includes a state machine and not a controller. The managing circuit can perform the steps discussed above with respect to various embodiments. Methods in accordance with some embodiments are performed by the state machine. In some implementations, the state machine is on the same integrated circuit chip as the array of storage elements.

Other features, aspects, and objects of the invention can be obtained from a review of the specification, the figures, and the claims.

DETAILED DESCRIPTION

The invention is illustrated by way of example and not by way of limitation in the figures of the accompanying drawings in which like references indicate similar elements. It should be noted that references to an or one embodiment in this disclosure are not necessarily to the same embodiment, and such references mean at least one.

In the following description, various aspects of the present invention will be described. However, it will be apparent to those skilled in the art that the present invention may be practiced with only some or all aspects of the present disclosure. For purposes of explanation, specific numbers, materials, and configurations are set forth in order to provide a thorough understanding of the present invention. However, it will be apparent to one skilled in the art that the present invention may be practiced without the specific details. In other instances, well-known features are omitted or simplified in order not to obscure the present invention.

Various operations will be described as multiple discrete steps in turn, in a manner that is most helpful in understanding the present invention, however, the order of description should not be construed as to imply that these operations are necessarily order dependent.

Figure 5:
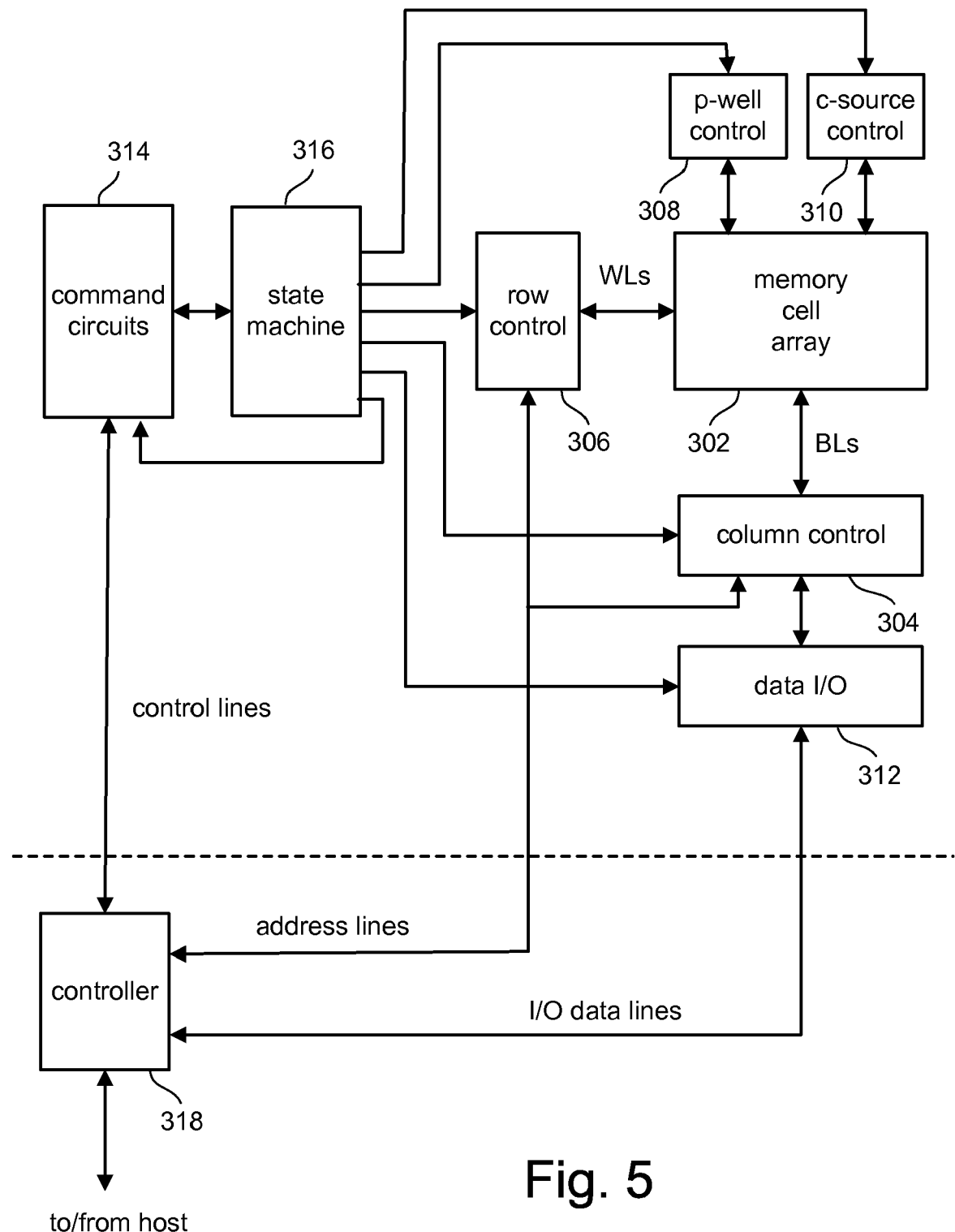
FIG. 5 is a block diagram of one embodiment of a non-volatile memory system in which the various aspects of the present invention can be implemented.

FIG. 5 is a block diagram of one embodiment of a flash memory system that can be used to implement the present invention. Memory cell array 302 is controlled by column control circuit 304, row control circuit 306, c-source control circuit 310 and p-well control circuit 308. Column control circuit 304 is connected to the bit lines of memory cell array 302 for reading data stored in the memory cells, for determining a state of the memory cells during a program operation, and for controlling potential levels of the bit lines to promote the programming or to inhibit the programming. Row control circuit 306 is connected to the word lines to select one of the word lines, to apply read voltages, to apply program voltages combined with the bit line potential levels controlled by column control circuit 304, and to apply an erase voltage. C-source control circuit 310 controls a common source line (labeled as "C-source" in FIG. 6) connected to the memory cells. P-well control circuit 308 controls the p-well voltage.

The data stored in the memory cells are read out by the column control circuit 304 and are output to external I/O lines via data input/output buffer 312. Program data to be stored in the memory cells are input to the data input/output buffer 312 via the external I/O lines, and transferred to the column control circuit 304. The external I/O lines are connected to controller 318.

Command data for controlling the flash memory device are input to controller 318. The command data informs the flash memory of what operation is requested. The input command is transferred to state machine 316 that controls column control circuit 304, row control circuit 306, c-source control 310, p-well control circuit 308 and data input/output buffer 312. State machine 316 can also output status data of the flash memory such as READY/BUSY or PASS/FAIL.

Controller 318 is connected to or connectable with a host system such as a personal computer, a digital camera, or personal digital assistant, etc. It communicates with the host that initiates commands, such as to store or read data to or from the memory array 302, and provides or receives such data. Controller 318 converts such commands into command signals that can be interpreted and executed by command circuits 314, which is in communication with state machine 316. Controller 318 typically contains buffer memory for the user data being written to or read from the memory array.

One exemplar memory system comprises one integrated circuit that includes controller 318, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the Controller being embedded in the host). Thus, the controller can be embedded in the host or included within the removable memory system.

Figure 6:
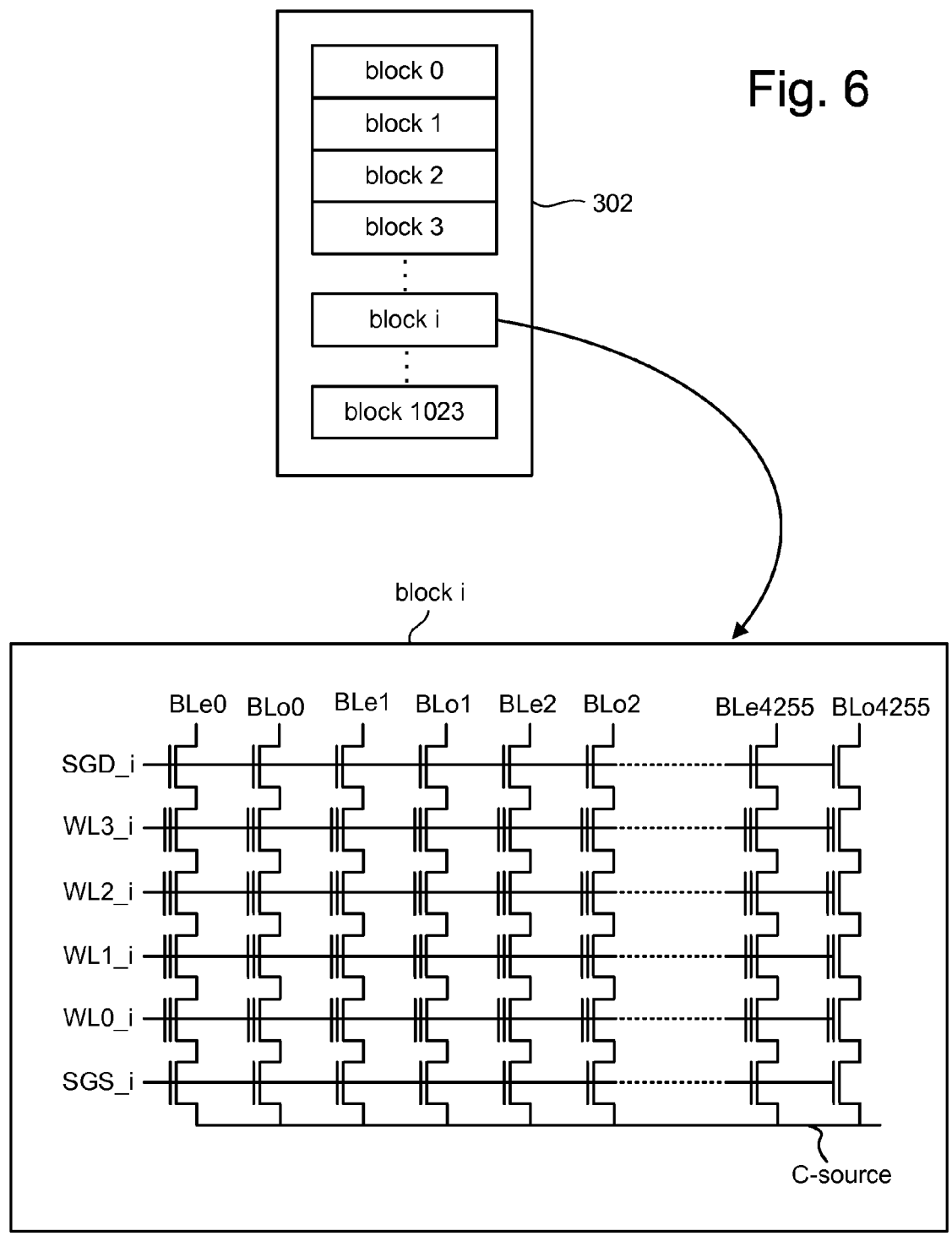
FIG. 6 illustrates an exemplary organization of a memory array.

With reference to FIG. 6, an exemplary structure of memory cell array 302 is described. As one example, a NAND flash EEPROM is described that is partitioned into 1,024 blocks. The data stored in each block is simultaneously erased. In one embodiment, the block is the minimum unit of cells that are simultaneously erased. In each block, in this example, there are 8,512 columns that are divided into even columns and odd columns. The bit lines are also divided into even bit lines (BLe) and odd bit lines (BLo). FIG. 6 shows four memory cells connected in series to form a NAND string. Although four cells are shown to be included in each NAND string, more or less than four can be used, for example 16, 32, or another number. One terminal of the NAND string is connected to the corresponding bit line via a first select transistor SGD, and another terminal is connected to c-source via a second select transistor SGS.

During read and programming operations, 4,256 memory cells are simultaneously selected. The memory cells selected have the same word line (e.g. WL2-i), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages.

Memory cells are erased in one embodiment by raising the p-well to an erase voltage (e.g. 20 volts) and grounding the word lines of a selected block. The source and bit lines are floating. Erasing can be performed on the entire memory array, separate blocks, or another unit of cells. Electrons are transferred from the floating gate to the p-well region and the threshold voltage becomes negative.

In the read and verify operations, the select gates (SGD and SGS) and the unselected word lines (e.g., WL0, WL1 and WL3) are raised to a read pass voltage (e.g. 4.5 volts) to make the transistors operate as pass gates. The selected word line (e.g. WL2) is connected to a voltage, a level of which is specified for each read and verify operation in order to determine whether a threshold voltage of the concerned memory cell has reached such level. For example, in a read operation of a one bit memory cell, the selected word line WL2 is grounded, so that it is detected whether the threshold voltage is higher than 0V. In a verify operation of a one bit memory cell, the selected word line WL2 is connected to 2.4V, for example, so that it is verified whether the threshold voltage has reached 2.4V or another threshold level. The source and p-well are at zero volts. The selected bit lines (BLe) are pre-charged to a level of, for example, 0.7V. If the threshold voltage is higher than the read or verify level, the potential level of the concerned bit line (BLe) maintains the high level, because of the non-conductive memory cell. On the other hand, if the threshold voltage is lower than the read or verify level, the potential level of the concerned bit line (BLe) decreases to a low level, for example less than 0.5V, because of the conductive memory cell (M). The state of the memory cell is detected by a sense amplifier that is connected to the bit line. The difference between whether the memory cell is erased or programmed depends on whether or not negative charge is stored in the floating gate. For example, if negative charge is stored in the floating gate, the threshold voltage becomes higher and the transistor can be in enhancement mode.

The erase, read and verify operations described above are performed according to techniques known in the art. Thus, many of the details explained can be varied by one skilled in the art.

Figure 7:
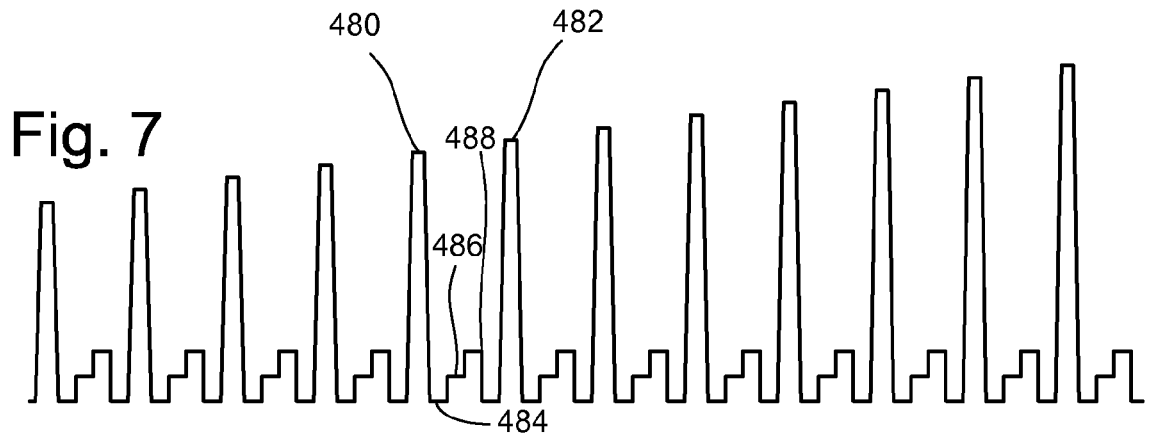
FIG. 7 depicts an exemplary program/verify voltage signal that can be applied to a selected word line in accordance with embodiments.

When programming a memory cell in one example, the drain and the p-well receive 0 volts while the control gate receives a set of programming pulses with increasing magnitudes, such as depicted in FIG. 7. In one embodiment, the magnitudes of the pulses range from 7 volts to 15 volts. In other embodiments, the range of pulses can be different, for example, having a starting level of 12 volts. During programming of a memory cell, verify operations are carried out in the periods between the pulses. That is, the programming level of each cell of a group of cells being programmed in parallel is read between each programming pulse to determine whether it is equal to or greater than a verify level to which it is being programmed. One means of verifying the programming is to test conduction at a specific compare point. The cells that are verified to be sufficiently programmed are locked out, for example in NAND cells, by raising the bit line voltage from 0 to Vdd (e.g., 2.5 volts) to stop the programming process for those cells. Various techniques for locking out cells or otherwise removing application of the programming pulse under conditions to alter the charge stored on a floating gate of the cell can be used. In some cases, the number of pulses will be limited (e.g. 20 pulses) and if a given memory cell is not completely programmed by the last pulse, then an error is assumed. In some implementations, memory cells are erased (in blocks or other units) prior to programming.

For arrays of flash memory cells, many cells are verified in parallel. For some embodiments of multi-state flash memory cells, after every individual program pulse the memory cells will experience a set of verification steps to determine which state the memory cell is within. For example, a multi-state memory cell capable of storing data in eight states may need to perform verify operations for seven compare points. Thus, seven verify pulses are applied in order to perform seven verify operations between two consecutive programming pulses. Based on the seven verify operations, the system can determine the state of the memory cells. One means for reducing the time burden of verifying is to use a more efficient verify process, for example, as disclosed in U.S. patent application Ser. No. 10/314,055, entitled "Smart Verify for Multi-State Memories," filed Dec. 5, 2002, incorporated herein by reference in its entirety.

Looking at FIG. 7, a program voltage signal is depicted. This signal has a set of pulses with increasing magnitudes. The magnitude of the pulses is increased with each pulse by a predetermined step size. In one embodiment that includes the memory cells storing multiple bits of data, an exemplary step size is 0.2 volts. Between the program pulses are verify pulses. The signal of FIG. 7 assumes a four state memory cell, therefore, it includes three verify pulses. For example, between programming pulses 480 and 482 are three verify pulses. The first verify pulse (or voltage level) 484 is depicted at zero volts. The second verify pulse 486 follows the first verify pulse (or voltage level). The third verify pulse 488 follows the second verify pulse 486.

Figure 8:
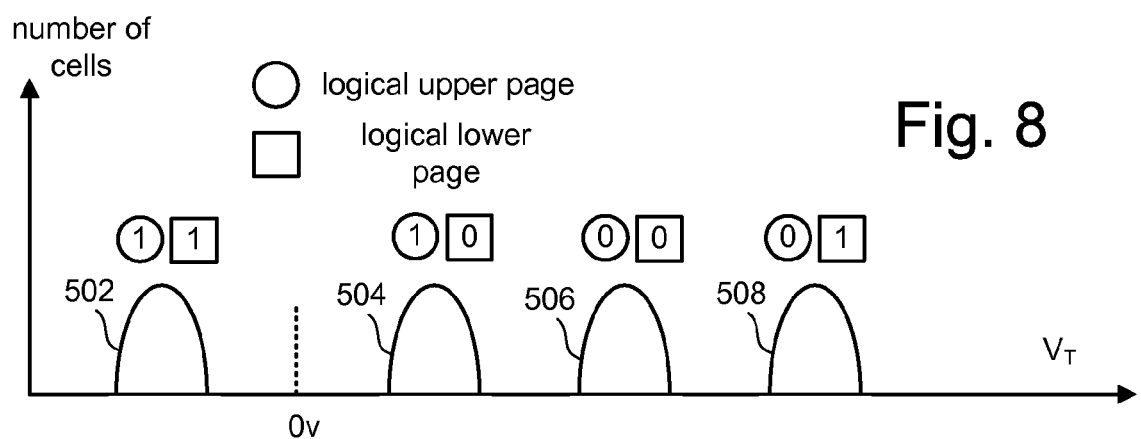
FIG. 8 depicts exemplary threshold distributions of storage elements storing two bits of data with four physical states.

FIG. 8 illustrates exemplary threshold voltage distributions for a memory cell array when each memory cell stores two bits of data in four physical states. Distribution 502 represents a distribution of threshold voltages of cells that are in the erased state (storing "11"), having negative threshold voltage levels. Distribution 504 represents a distribution of threshold voltages of cells that are in a first programmed state, storing "10." Distribution 506 represents a distribution of threshold voltages of cells that are in a second programmed state, storing "00." Distribution 508 represents a distribution of threshold voltages of cells that are in a third programmed state, storing "01." Each of the two bits stored in a single memory cell, in this example, is from a different logical page. That is, each bit of the two bits stored in each memory cell carries a different logical page address. The bit displayed in the square corresponds to a lower page. The bit displayed in the circle corresponds to an upper page. In one embodiment, the logical states are assigned to the physical states of memory cells using a gray code orientation so that if the threshold voltage of a floating gate erroneously shifts, only one bit will be affected.

Figure 9:
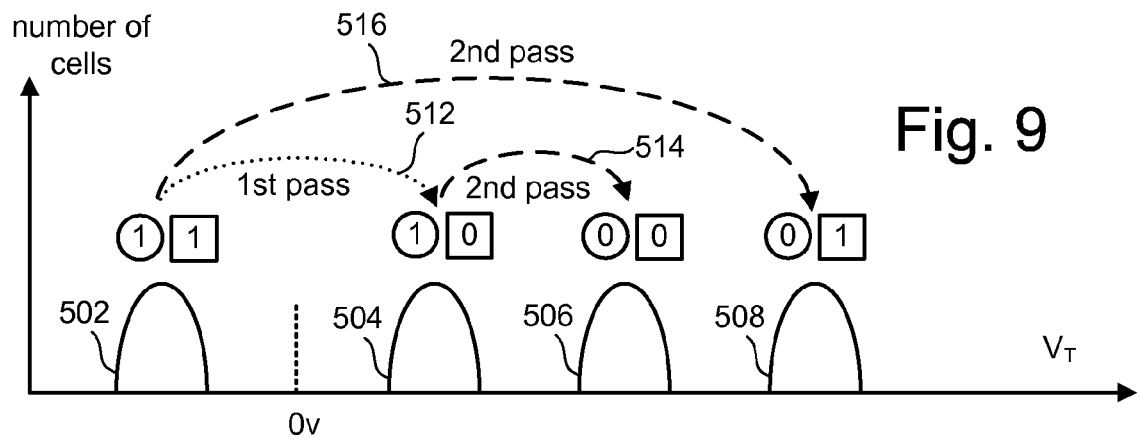
FIG. 9 depicts exemplary threshold voltage distributions of storage elements and one example of a technique for programming multi-state memory cells to four physical states.

FIG. 9 illustrates an example of a two pass technique of programming a 4-state NAND memory cell such as a memory cell of the array whose threshold voltage distributions are illustrated in FIG. 8. In a first programming pass, the cell's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the cell is increased to be within threshold voltage distribution 504, as shown by arrow 512. That concludes the first programming pass.

In a second programming pass, the cell's threshold voltage level is set according to the bit being programmed into the upper logical page. If the upper logical page bit is to store a logic "1," then no programming occurs since the cell is in one of the physical states corresponding to threshold voltage distributions 502 or 504, depending upon the programming of the lower page bit, both of which carry an upper page bit of "1." If the upper page bit is to be a logic "0," however, the cell is programmed a second time. If the first pass resulted in the cell remaining in the erased state corresponding to threshold distribution 502, then in the second phase the cell is programmed so that the threshold voltage is increased to be within threshold distribution 508, as shown by arrow 516. If the cell had been programmed into the state corresponding to threshold distribution 504 as a result of the first programming pass, then the memory cell is further programmed in the second pass so that the threshold voltage is increased to be within threshold voltage distribution 506, as depicted by arrow 514. The result of the second pass is to program the cell into the state designated to store a logic "0" for the upper page without changing the result of the first programming pass.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be so assigned, in which case the states between which programming occurs can be different than those depicted in FIGS. 9-10.

Figure 1:
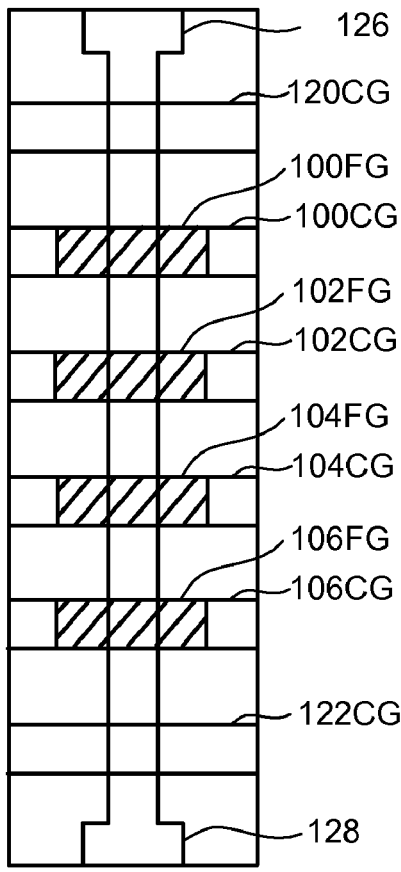
FIG. 1 is a top view of a NAND string.
Figure 2:
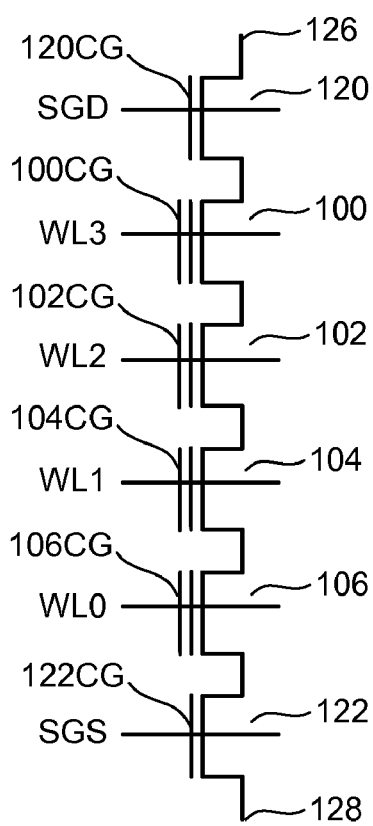
FIG. 2 is an equivalent circuit diagram of the NAND string depicted in FIG. 1.
Figure 3:
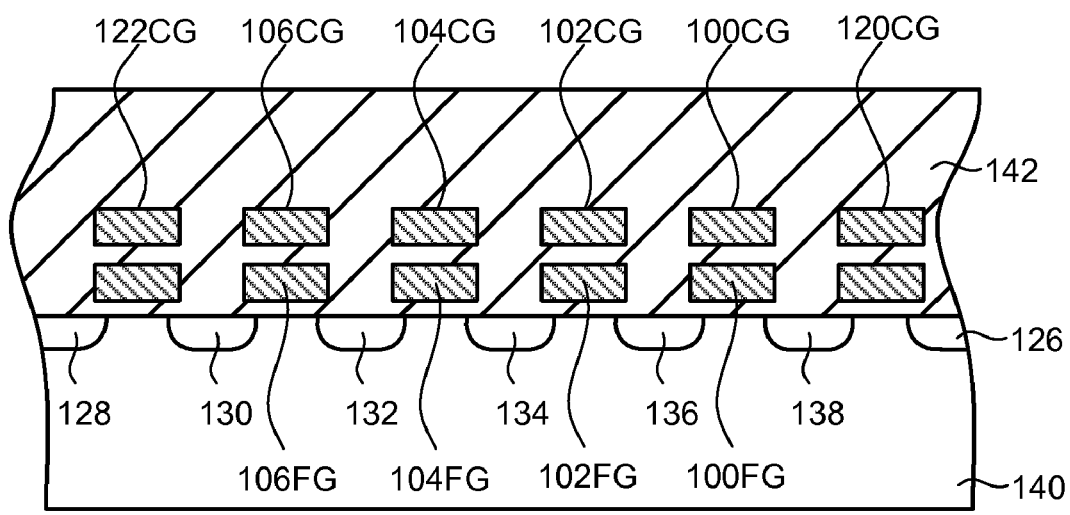
FIG. 3 is a cross sectional view of the NAND string of FIG. 1.
Figure 4:
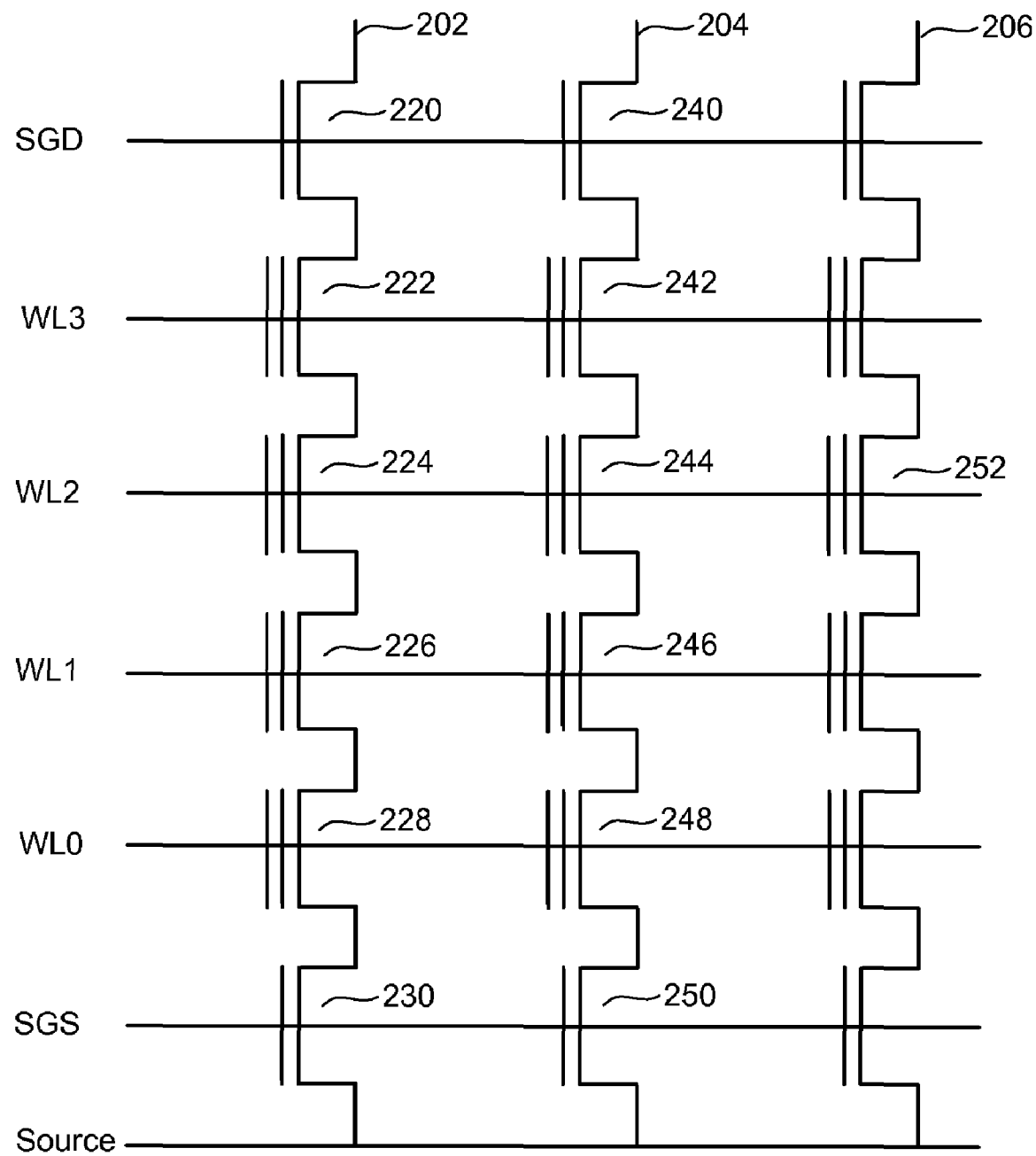
FIG. 4 is a circuit diagram depicting three NAND strings.

Normally, the cells being programmed in parallel are alternate ones along a word line. For example, FIG. 4 illustrates three memory cells 224, 244 and 252 of a much larger number of cells along one word line WL2. One set of alternate cells, including cells 224 and 252, store bits from logical pages 0 and 2 ("even pages"), while another set of alternate cells, including the cell 244, store bits from logical pages 1 and 3 ("odd pages").

In order to provide improved reliability, it is desirable for the individual threshold distributions of physical states to be tightened (distribution narrowed), because the tighter distribution brings a wider read and program margin (distance between states). However, charge coupling between floating gates of memory cells can cause an increase in the apparent charge stored on a floating gate. The increase in apparent charge can cause an increase in the threshold voltage of an individual memory cell and thus, a wider distribution of voltages corresponding to some physical states.

Shifts in the apparent charge stored on a floating gate can occur because of the existence of an electric field resulting from the charge on adjacent floating gates. A difficulty is that adjacent memory cells can be either programmed or erased at a time after the present cell now being read was programmed. For example, consider that one set of cells is programmed to add a level of charge to their floating gates to correspond to one set of data. After a second set of cells (e.g., adjacent to the first set of cells) is programmed with a second set of data, the charge levels read from the floating gates of the first set of cells sometimes appears to be different than programmed because of the effect of the electric field from the second set of floating gates. That is, observed errors can be due to the influence of electric field from adjacent floating gates upon the apparent voltage level of the floating gate of the cell being read. This is known as the Yupin effect, and is described more fully in U.S. Pat. Nos. 5,867,429 and 5,930,167, which patents are incorporated herein by reference in their entirety. In NAND type memory devices, memory cells can experience charge coupling from floating gates on neighboring bit lines as well as on neighboring word lines. However, word line to word line charge coupling typically predominates any bit line to bit line charge coupling.

Certain memory cells of a memory array will experience a reduced level or no Yupin effect. Referring to FIG. 4, for example, and assuming that programming of the NAND strings depicted therein occurs from the source side to the drain side, memory cells connected to the last word line, WL3, will experience little or no Yupin effect. Because they are the last memory cells to be programmed for the string during a program operation, there will be little or no charge coupling from subsequently programmed floating gates. Memory cells of other word lines, however, will be programmed subsequent to programming word lines 0, 1, or 2.

For example, the charge stored on the floating gate of memory cell 228 may be programmed to a desired level representing a target physical state for the memory cell. After programming memory cell 228, memory cells connected to word line 1 will be programmed. The charge stored on the floating gate of memory cell 226 may be increased during a subsequent step of the program operation. The electrical field from the floating gate of memory cell 226, after being programmed, can influence the apparent charge level of the floating gate of memory cell 228. This increase in the apparent charge stored on the floating gate of memory cell 288 will cause the threshold voltage of the memory cell to increase. The effect of increased apparent charge on floating gates of memory cells in the cell array will widen the threshold voltage distributions of the physical states of the memory cells.

The memory cells connected to WL3, however, will experience little or no change in threshold voltage from the electric field of other memory cells on the same NAND string. As previously discussed, during a program operation, no memory cells will be programmed for a particular string subsequent to programming the memory cell connected to WL3. Accordingly, there will be no influences from adjacent floating gates programmed subsequent to the memory cell connected to WL3. If programming occurs from an even bit line to an odd bit line for example, a cell connected to an even bit line may experience a small charge coupling from adjacent odd bit lines. The amount of coupling is small in comparison to word line to word line coupling. Accordingly, the threshold voltage distributions of memory cells connected to WL3 will not be widened to a degree experienced by memory cells connected to other word lines due to charge coupling.

Figure 10:
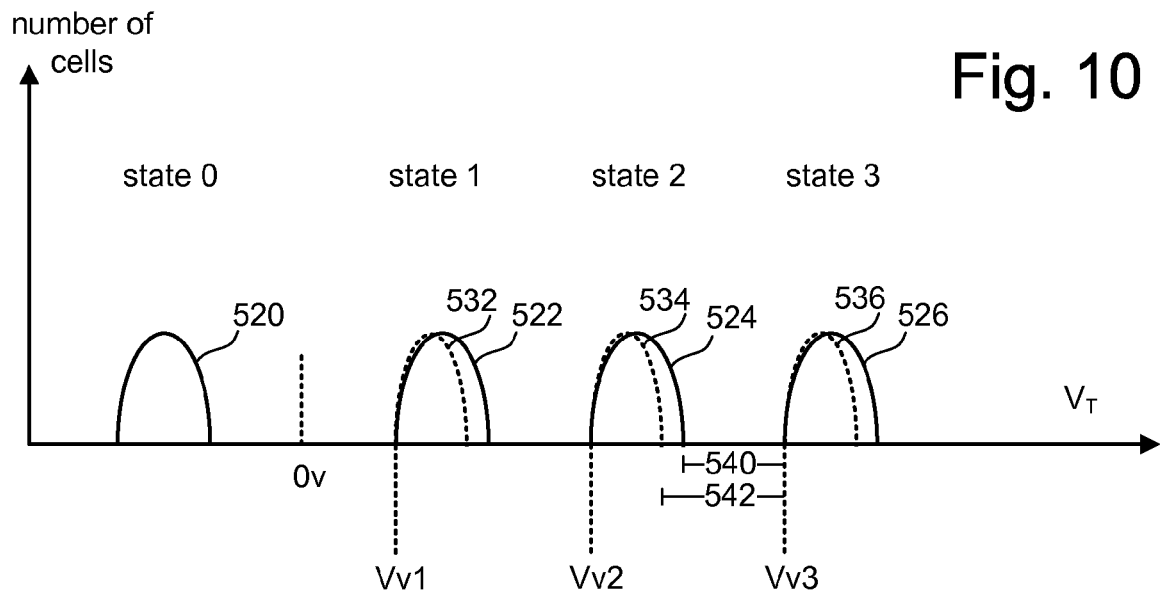
FIG. 10 depicts exemplary threshold voltage distributions of a group of storage elements programmed to four physical states.

FIG. 10 illustrates threshold voltage distributions for a memory cell array, such as that depicted in FIGS. 4 and 6, when each memory cell stores two bits of data in one of four physical states (0, 1, 2, 3). FIG. 10 shows a first set of distributions 522, 524, and 526 representing the threshold voltage distributions for the memory cells connected to a first set of word lines (e.g., WL0-WL2). Distribution 520 represents the distribution of all cells in the erased state. There is also illustrated a second set of distributions 532, 534, and 536 representing the threshold voltage distributions of memory cells connected to a last word line (e.g., WL3). It will be appreciated that numerous other configurations can be used (e.g., a 16, 32, or more cells per string storing 3 bits or more of data).

The second set of distributions, representing the memory cells connected to WL3, are tighter than the first set of distributions representing memory cells connected to the other word lines. For example, distributions 522, 524, and 526 can have widths on the order of 0.5V or 0.4V, while distributions 532, 534, and 536 can have widths on the order of 0.3V or 0.2V. The voltages presented herein are for purposes of explanation and example only. The first set of distributions are wider than the second set of distributions due to charge coupling between adjacent memory cells as previously described.

Reliable data storage requires that the multiple ranges of threshold voltage levels of a multi-state memory cell be separated from each other by sufficient margin so that the level of the memory cell can be programmed and read in an unambiguous manner. In typical memory devices, a single set of read and verify levels is used for all memory cells of the system without regard for the word line to which a particular memory cell is connected. For example, a program verify level such as $V_v2$ will be used when programming any memory cell of the system to state 2. These levels are established at positions that will maintain adequate separation between threshold voltage ranges and account for the wider distribution of threshold voltages caused by cross-coupling from adjacent floating gates. For example, program verify level $V_v2$ is established at a level that will maintain an adequate separation between the highest possible threshold voltage of physical state 1, and the lowest possible threshold voltage of physical state 2. This level will maintain adequate separation between the states given the wider distribution of threshold voltages due to the Yupin effect.

As can be seen by looking at FIG. 10, using a single set of verify levels without regard to the word line to which a memory cell is connected, can lead to over-compensation and subsequently higher verify and target levels than are needed for some memory cells, particularly those connected to a last word line of a string. As previously discussed, the last word line can experience a greater amount of program disturb than other word lines due to insufficient boosting, for example. The program disturb is largely caused by high program voltages or pulses. By reducing the level of program voltage applied to the last word line during programming, the program disturb at the last word line can be decreased.

In accordance with one embodiment, an additional set of program verify and/or read levels are established for select memory cells or word lines. For example, an additional set of verify levels can be used for the last word line of a group of cells being programmed. An additional set of levels can also be used for other select cells or word lines such as the next to last word line, etc. Any word line having tighter threshold distributions can benefit from and reliably be programmed using additional target and verify levels. Because the voltage distributions for the word lines are tighter than the voltage distributions for other word lines, one or more levels in the additional set can be lower than a corresponding level in the first set of levels (assuming a threshold voltage verification parameter for example). Using lower program verify levels can decrease the program voltage required to program a storage element to a particular state. By using a lower program voltage, the occurrence or amount of program disturb experienced by a memory cell can be reduced.

Figure 11:
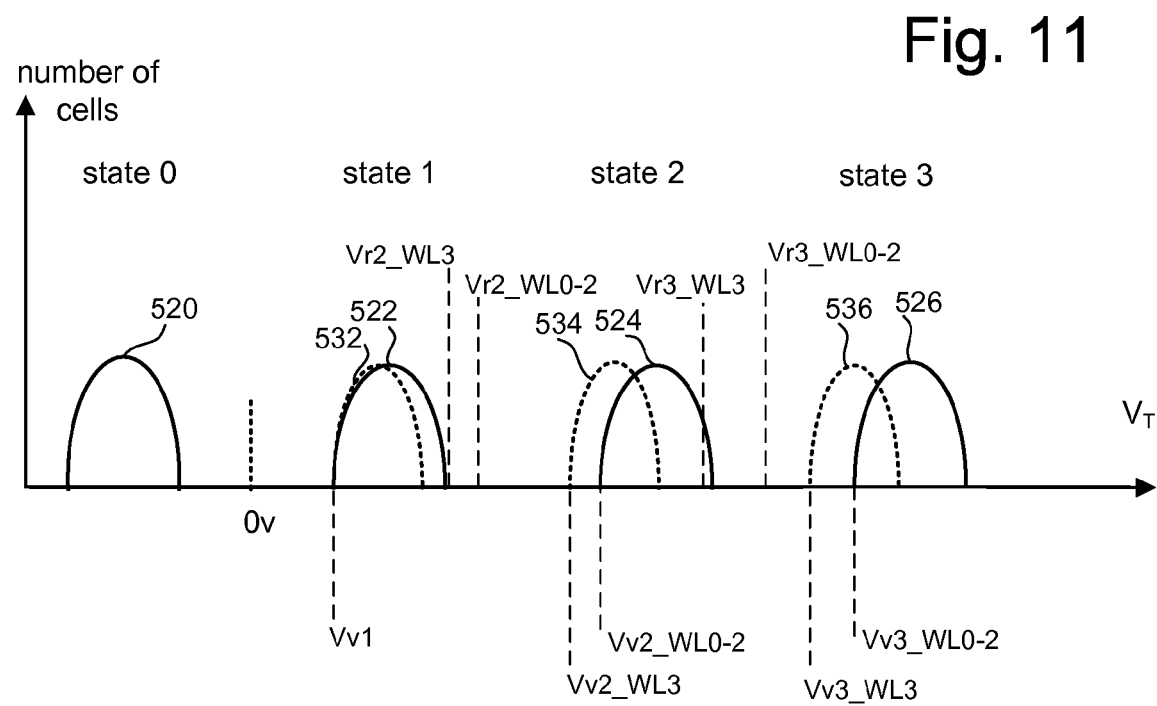
FIG. 11 depicts exemplary threshold voltage distributions and verify levels for a memory cell array programmed in accordance with one embodiment.

FIG. 11 illustrates exemplary threshold voltage distributions resulting from the use of two sets of program verify levels. The lower program verify levels for states 2 and 3 result in a shift of the threshold voltage distribution of cells connected to WL3. Memory cells connected to WL0-WL2 have threshold voltage distributions denoted as 522, 524, and 526, for physical states 1, 2, and 3, respectively. A memory cell connected to WL0-WL2 is programmed to states 1, 2, and 3 using program verify levels Vv1 (e.g., 0.4V), Vv2_WL0-2 (e.g., 1.5V), and Vv3_WL0-2 (e.g., 2.8V). For example, a memory cell connected to WL0 that is intended to be programmed to state 2 will have its threshold voltage programmed above program verify level Vv2_WL0-2. In one embodiment, a control gate voltage verification parameter equal to the verify level is applied to the memory cell. If the memory cell is conductive when a control gate voltage equal to level Vv3_WL0-2 is applied, but is not conductive when a control gate voltage equal to level Vv2_WL0-2 is applied, the memory cell is verified as programmed to state 2.

Memory cells connected to WL3 have threshold voltage distributions denoted as 532, 534, and 536 for states 1, 2, and 3, respectively. Physical states 2 and 3 have lower target levels for the last word line programmed (e.g., WL3), resulting in the shifted distributions 534 and 536 shown in FIG. 11. Lower program verify levels Vv2_WL3 (e.g., 1.3V) and Vv3_WL3 (e.g., 2.4V) are used when programming memory cells connected to WL3. For example, a memory cell intended to be programmed to state 2 will be programmed until its threshold voltage is at or above program verify level Vv2_WL3. Even though the threshold voltage distributions are shifted for the last word line, physical state 2 for WL0-2 is the same physical state as physical state 2 for WL3. Therefore, physical states 2 and 3 have lower target levels (e.g., Vv2_WL3 vs. Vv2_WL0-2), and thus, lower minimum voltages for the last word line to be programmed (e.g., WL3) than for the other word lines. In other embodiments, an additional verify level for the last word line can also be used for state 1.

A second set of read levels can be established for word line(s) programmed using a second set of verify levels. Referring again to FIG. 11 as an example, Vr2_WL3 (e.g., 0.9V) is a state 2 read level for memory cells connected to WL3 while Vr2_WL0-2 (e.g., 1.1V) is a state 2 read level for memory cells connected to WL0-WL2. Vr3_WL3 (e.g., 1.8V) is a state 3 read level for memory cells connected to WL3 while Vr3_WL0-2 (e.g., 2.2V) is a state 3 read level for memory cells connected to WL0-WL2. Although not shown, one or more state 1 read levels can be used and set to a value of around 0V, for example. The second set of read levels for WL3 can be used in conjunction with the second set of verify levels used for WL3. However, the second of set read levels need not be used. For example, the read levels corresponding to WL0-WL2 can be used for WL3 even when the memory cells connected to WL3 have been programmed using a second set of verify levels. Memory cells programmed using the second set of verify levels can properly be read using the first set of read levels as will be apparent to one of ordinary skill in the art.

The range of threshold voltages, that if read during a read operation would indicate a particular physical state, are also shifted when additional read levels are used. For example, if the programmed threshold voltage of a cell connected to WL3 is determined to be in between Vr2_WL3 and Vr3_WL3, that cell will be read as in physical state 2. A cell connected to WL0-2, however, will be read as in physical state 2 if its programmed threshold voltage is determined to be in between Vr2_WL0-2 and Vr3_WL0-2. Even though the ranges of voltages are different, the physical states for the last word line are the same as for the other word lines. In embodiments using a single set of read levels, the range of threshold voltages, that if read would indicate a particular state, will be the same irrespective of word line. However, the distributions of actual threshold voltages will be shifted due to the additional set of program verify or target levels.

Lower program voltages are used when programming memory cells having lower verify levels in one embodiment. In the example of FIG. 4, a lower program voltage can be applied to program memory cells of WL3 to select states. Since a lower verify or target level is used for states 2 and 3 when programming WL3, a lower charge is required to be stored in the cell before the cell reaches state 2 or 3. Since the amount of required charge is less, a lower program voltage can be applied to increase the charge stored in the cell to the lower required level. In one embodiment, a different program voltage or program voltage signal can be used when programming WL3 so that lower program voltages are used. In other embodiments, the same signal can be used when programming WL3 as well as other word lines.

For example, an incremental program voltage as illustrated in FIG. 7 can be used in one embodiment. As previously described, the incremental voltage is removed from application to those cells that verify as reaching their target states. Since the verify level, and consequently the required programmed threshold voltage, is lower for WL3, it is probable that fewer pulses will be required before a cell connected to WL3 is verified as programmed to a select state. That is, a lower stored charge or threshold voltage is required of memory cells connected to WL3. Accordingly, these cells will reach their target threshold voltage levels sooner than the cells of other word lines. The program voltage will be removed from these cells sooner, resulting in the application of fewer program pulses and/or a lower peak program pulse.

Figure 12:
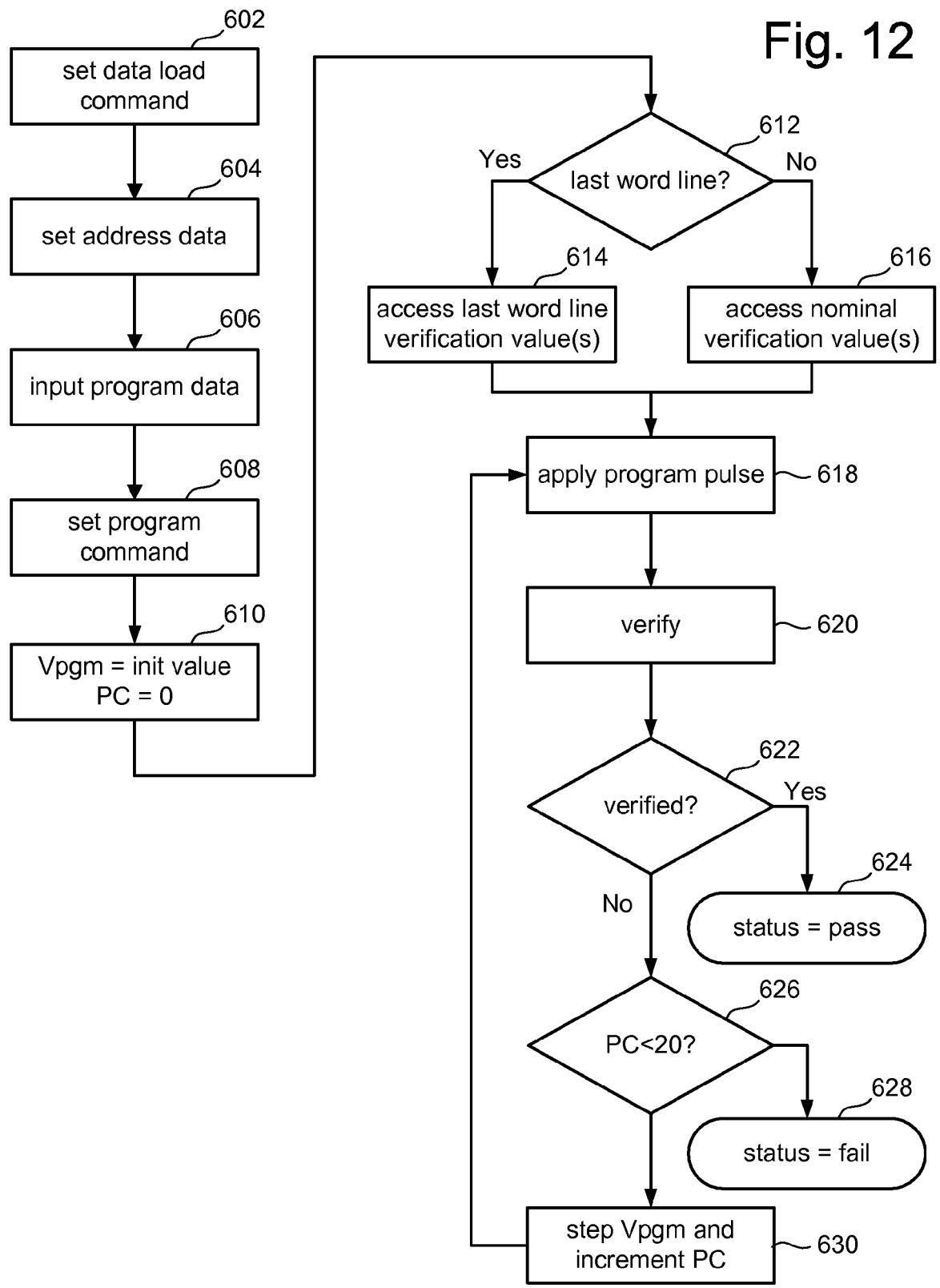
FIG. 12 is a flowchart of a programming process in accordance with one embodiment.

FIG. 12 is a flow chart describing a method for programming a memory system in accordance with one embodiment. As will be apparent to those of ordinary skill in the art, various steps can be modified, added, or removed depending on a specific application or implementation while still remaining within the scope and spirit of the present disclosure. In a two-pass programming operation as previously described, for example, multiple programming or verification steps may be used in a single iteration. In various implementations, memory cells are erased (in blocks or other units) prior to programming. At step 602 of FIG. 12, a data load command is issued by controller 318 and input to data input/output buffer 312. The input data is recognized as a command and latched by state machine 316 because a command latch signal, not illustrated, is input to command circuits 314. In step 604, address data designating the page address is input to data input/output buffer 312 from controller 318. The input data is recognized as the page address and latched by state machine 316, because the address latch signal is input to command circuits 314. At step 606, 532 bytes of program data are input to data input/output buffer 312. It should be noted that 532 bytes of program data are specific to the particular implementation described and other implementations will require or utilize various other sizes of program data. That data can be latched in a register for the selected bit lines. In some embodiments, the data is also latched in a second register for the selected bit lines to use for verify operations. At step 608, a program command is issued by controller 318 and input to data input/output buffer 312. The command is latched by state machine 316 because the command latch signal is input to command circuits 314.

At step 610, Vpgm is initialized to the starting pulse (e.g. 12 volts) and a program counter PC maintained by state machine 316, is initialized at 0. At step 612, a determination is made as to what word line is being programmed. If the word line being programmed is the last word line to be programmed for the string during the program operation, the flow chart continues at step 614. If the word line being programmed is not the last word line to be programmed for the string during the program operation, the flow chart continues at step 616. At step 616, nominal verification parameter values or target levels are retrieved. The nominal values can be typical verification values used when programming the memory system. As discussed, these values may account for charge coupling that leads to wider threshold voltage distribution for the memory cells. In one embodiment, for example, the nominal program verification values are the values $V_v1$, $V_v2\_WL0-2$, and $V_v3\_WL0-2$, illustrated in FIG. 11. If the last word line of the string is being programmed, then verification parameter values for the last word line can be retrieved at step 614. As previously discussed, the verification parameter values for the last word line can be lower than the nominal verification parameter values (assuming a threshold voltage verification parameter). These lower verification parameter values maintain adequate separation between threshold voltage ranges used to represent data states because of the lack of Yupin effect on memory cells connected to the last word line, and thus, tighter threshold voltage distributions than the memory cells connected to the other word lines.

At step 618, a program voltage (Vpgm) pulse is applied to the selected word line. The bit lines including a memory cell to be programmed are grounded while the other bit lines are connected to VDD to inhibit programming. At step 620, the states of the selected memory cells are verified. The selected memory cells are verified using the verification parameter values retrieved at step 616 or step 614. As described, various verification parameters can be used at step 620. For example, a verification parameter of sensed drain source current of a memory cell can be used in one embodiment. In another embodiment, a control gate voltage applied to a memory cell can be used as a verification parameter. If it is detected that the target threshold voltage of a selected cell has reached the appropriate level (for example, the programmed level for logic 0 or a particular state of a multi-state cell), then the selected cell is verified as programmed to its target state. If it is detected that the threshold voltage has not reached the appropriate level, the selected cell is not verified as programmed to its target state. Those cells verified as programmed to their target state at step 620 will be excluded from further programming. At step 622, it is determined whether all cells to be programmed have been verified, such as by checking an appropriate data storage register. If so, the programming process is complete and successful because all selected memory cells were programmed and verified. A status of pass is reported in step 624. If at step 622, it is determined that not all of the memory cells have been verified, then the programming process continues. At step 626, the program counter PC is checked against a program limit value. One example of a program limit value is 20. If the program counter PC is not less than 20, then the program process has failed and a status of fail is reported at step 628. If the program counter PC is less than 20, then the Vpgm level is increased by the step size and the program counter PC is incremented at step 630. After step 630, the process loops back to step 618 to apply the next Vpgm pulse.

At the end of a successful program process, the threshold voltages of the memory cells should be within one or more distribution of threshold voltages for programmed memory cells or within a distribution of threshold voltages for erased memory cells. In accordance with one embodiment, a memory cell connected to the last word line of a string may be programmed within a first voltage distribution representing a particular physical state, while a memory cell connected to one of the other word lines of the string may be programmed within a second threshold voltage distribution to represent the same physical state.

Various verification parameters can be used in accordance with embodiments after applying a program voltage or pulse to a selected memory cell or cells. A verification parameter can be used to determine whether the memory cell has reached its target state by verifying that the memory cell's programmable threshold voltage is above a minimum verify level or at a target level for a particular physical state. In one embodiment, for example, a sensed drain source current of the memory cell is used as a verification parameter.

In accordance with one embodiment, a larger step size can be used to increment program pulses when programming a last word line or a word line near to the last word line of a group such as a NAND string. In this embodiment, the verify levels for memory cells connected to the last word line can be the same as those used for cells connected to other word lines although it is not required that they be so. As illustrated in FIG. 10, the threshold voltage distributions for memory cells connected to the last word line are tighter than corresponding threshold distributions for memory cells connected to other word lines. This results in a greater separation between the largest possible threshold voltage of a memory cell in a first state and a smallest possible threshold voltage of a memory cell in the next state. For example, the separation 542 between potential threshold voltage levels representing states 2 and 3 for a memory cell connected to WL3 is greater than the separation 540 between potential threshold voltages representing states 2 and 3 for a memory cell connected to another word line. In one embodiment, separation 540 can be on the order of 0.9V while separation 542 is on the order of 1.1V.

A program voltage step size of 300 millivolts may be used for typical memory cells having a distribution of about 300 millivolts, such as those of WL0-2 of FIG. 11. The small step size for increasing the program voltage pulses is used so that a memory cell is accurately programmed within a target threshold voltage range without overprogramming. While an increased step size can increase programming times, an increased size can result in wider threshold voltage distributions and consequently, less separation between voltages representing various states. However, with a greater separation between potential threshold voltages representing different states, a greater step size can be used while still maintaining an adequate separation. For example, the last word line of a string can be programmed with a larger program step size while still maintaining accurate programming and adequate separation. In one embodiment, a program voltage step size of 500 millivolts may be used to increment pulses for memory cells of a last word line. The 500 millivolt step size can still maintain accurate programming of a memory cell into a target state. The resulting widths of the threshold voltage distributions of WL3 may increase, but will only increase to be similar to those for the other word lines. By using an increased program step size, programming time for a memory cell or word line can be reduced. By reducing the programming time for select memory cells such as those connected to a last word line, overall programming time for an entire memory system can be reduced.

Figure 13:
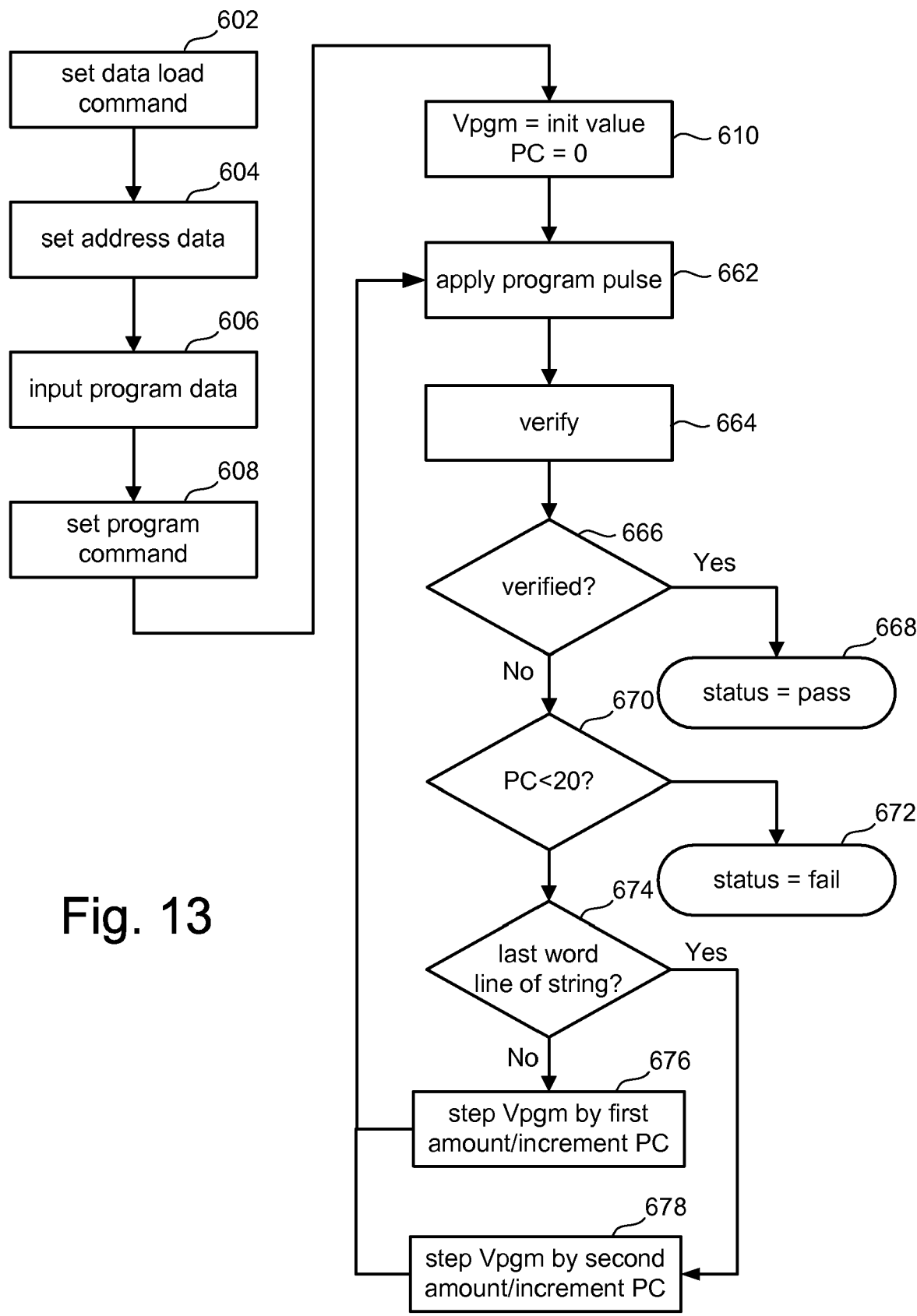
FIG. 13 is a flowchart of a programming process in accordance with one embodiment.

FIG. 13 is a flow chart illustrating a method for programming a memory system in accordance with one embodiment, wherein a variable program step size is used depending on the word line to which a memory cell is connected. Steps 602 through 610 correspond to steps 602 through 610 of FIG. 12. At step 662, a program pulse is applied to the selected word line, for example, WL2 or WL3 of FIG. 4. The bit lines including a memory cell to be programmed are grounded while the other bit lines are connected to VDD to inhibit programming.

At step 664, the states of the selected memory cells are verified. If it is detected that the target threshold voltage of a selected cell has reached the appropriate level, for example, the programmed level for logic 0 or a particular state of a multi-state cell, then the selected cell is verified as programmed to its target state. If it is detected that the threshold voltage has not reached the appropriate level, then the selected cell is not verified as programmed to its target state. Those cells that are verified at step 644 will be excluded from further programming. At step 666, it is checked whether all cells to be programmed have been verified, such as by checking an appropriate data storage register. If so, the program processing is complete and successful because all selected memory cells were programmed and verified. A status of pass is reported at step 668. If in step 666 it is determined that not all of the memory cells have been verified, then the programming process continues. At step 670, the program counter PC is checked against a program limit value. One example of a program limit value is 20. If the program counter PC is not less than 20, then the program process has failed and a status of fail is reported at step 672.

At step 674, a determination is made as to whether the selected word line being programmed is the last word line of the string to be programmed during the program operation. If the selected word line is not the last word line of the string, Vpgm is increased by a first step size and PC is incremented at step 676. After stepping Vpgm and incrementing PC, operation of the flow chart continues at step 662. If it is determined at step 674 that the last word line of the string is the selected word line, Vpgm is increased by a second step size at step 678. PC is also incremented at this step. The second step size used at step 678 is larger than the first step size used at step 676. After incrementing PC and stepping Vpgm, operation of the flow chat continues at step 662.

Much of the present disclosure has been presented under the assumption that that a verification process is performed by applying a particular voltage to the control gate and determining whether the memory cell turns on or off. However, there are other means of verifying (and reading) a memory cell and other verification parameters to determine the state of a memory cell that can also be used within the spirit of the present invention. For example, a current-sensing system can be used in which a current of the storage unit under a certain read condition is compared with a set of reference currents. In another embodiment, state of a storage unit can be determined using a number of different parameters. For example, the determination of a cell's stored charge level can be performed by current sensing, where the magnitude of its conduction, using fixed bias conditions, is sensed. Alternatively, such determination can be made through sensing threshold voltages, where the onset of such conduction is sensed using various steering gate bias conditions. Alternatively, the determination can be performed dynamically by having the cell's charge-level determined driver-strength control the discharge rate of a dynamically held sense node (by, e.g. a pre-charged capacitor). By sensing the time to reach a given discharge level, the stored charge level is determined. In this case, the parameter indicative of the cells condition is a time. This approach is described in U.S. Pat. No. 6,222,762, incorporated herein by reference in its entirety. Another alternative technique is one in which the state of the storage unit is determined using frequency as the parameter, as described in U.S. Pat. No. 6,044,019, which is hereby incorporated by reference in its entirety. Current sensing approaches are more fully developed in U.S. Pat. No. 5,172,338, which also is incorporated by reference in its entirety.

The above examples are provided with respect to NAND type flash memory. However, the principles of the present invention have application to other types of non-volatile memories, including those currently existing and those contemplated to use new technology being developed.

The foregoing description of embodiments of the present invention has been provided for the purposes of illustration and description. It is not intended to be exhaustive or to limit the invention to the precise forms disclosed. Many modifications and variations will be apparent to the practitioner skilled in the art. Embodiments were chosen and described in order to best describe the principles of the invention and its practical application, thereby enabling others skilled in the art to understand the invention, the various embodiments and with various modifications that are suited to the particular use contemplated. It is intended that the scope of the invention be defined by the following claims and their equivalents.

What is claimed is:

1. A non-volatile memory system, comprising:
   a first subset of non-volatile storage elements having a first set of physical states, the first set of physical states including a first state having a first minimum threshold voltage for the first subset of storage elements;
   a second subset of non-volatile storage elements having the first set of physical states, the first state having a lower minimum threshold voltage for the second subset of storage elements; and
   managing circuitry in communication with the first and second subset of non-volatile storage elements, the managing circuitry reads the first subset of storage elements using a first read value corresponding to the first physical state and reads the second subset of storage elements using a lower read value corresponding to the first physical state.

2. The non-volatile memory system of claim 1, wherein:
   the first set of physical states includes a second physical state having a second minimum threshold voltage for the second subset of storage elements and the first subset of storage elements.

3. The non-volatile memory system of claim 2, wherein the second physical state includes lower threshold voltages than the first physical state.

4. The non-volatile memory system of claim 1, further comprising:
   a set of word lines including a first word line in communication with the first subset of storage elements and a second word line in communication with the second subset of storage elements;
   wherein the managing circuitry programs the set of word lines in a sequence that applies a program voltage to the second word line after applying a program voltage to the first word line.

5. A non-volatile memory system, comprising:
   a first subset of non-volatile storage elements;
   a second subset of non-volatile storage elements; and
   managing circuitry that programs storage elements of the first subset and the second subset to one or more physical states of a set of physical states, the one more physical states including a first physical state defined by a first verify voltage for the first subset of storage elements and a second verify voltage for the second subset of storage elements, the managing circuitry reads the first subset of storage elements using a first read voltage associated with the first physical state and reads the second subset of storage elements using a second read voltage associated with the first physical state.

6. The non-volatile memory system of claim 5, wherein:
   the second verify voltage is lower than the first verify voltage; and
   the second read voltage is lower than the first read voltage.

7. The non-volatile memory system of claim 6, further comprising:
   a first word line in communication with the first subset of storage elements and the managing circuitry; and
   a second word line in communication with the second subset of storage elements and the managing circuitry;
   wherein the managing circuitry performs one or more program operations that include beginning programming for the second subset of storage elements after beginning programming for the first subset of storage elements.

8. The non-volatile memory system of claim 5, wherein:
   the first subset and the second subset of non-volatile storage elements are part of an array of NAND flash memory cells.

9. The non-volatile memory system of claim 5, wherein:
   the managing circuitry includes row control circuitry and column control circuitry.

10. A non-volatile memory system, comprising:
   a first subset of non-volatile storage elements;
   a second subset of non-volatile storage elements;

managing circuitry that programs storage elements of the first subset to one or more physical states of a set of physical states in accordance with user data using a program voltage and a first step size for the program voltage, the one more physical states including a first physical state defined by a first verify voltage for the first subset of storage elements; and the managing circuitry programs storage elements of the second subset to the one or more physical states in accordance with the user data using a program voltage and a second step size for the program voltage, the first physical state defined by a second verify voltage for the second subset of storage elements.

11. The non-volatile memory system of claim 10, wherein:
the managing circuitry reads the first subset of storage elements using a first read voltage associated with the first physical state; and
the managing circuitry reads the second subset of storage elements using a second read voltage associated with the first physical state.

12. The non-volatile memory system of claim 11, wherein:
the second verify voltage is lower than the first verify voltage;
the second read voltage is lower than the first read voltage; and
the second step size is larger than the first step size.

13. The non-volatile memory system of claim 10, further comprising:
a first word line in communication with the first subset of non-volatile storage elements; and
a second word line in communication with the second subset of non-volatile storage elements;
wherein the managing circuitry begins programming the second subset of storage elements after beginning programming of the first subset of non-volatile storage elements.

14. The non-volatile memory system of claim 13, wherein:
the first word line and the second word line are part of a set of word lines, the second word line is adjacent to a set of select gates for the memory system; and
the managing circuitry begins programming for storage elements of the second word line after beginning programming for storage elements of the other word lines of the set during program operations.

15. The non-volatile memory system of claim 10, wherein:
the managing circuitry reads the first subset of storage elements using a first read voltage associated with the first physical state; and
the managing circuitry reads the second subset of storage elements using the first read voltage associated with the first physical state.

16. The non-volatile memory system of claim 4, wherein:
the managing circuitry programs non-volatile storage elements of the first subset of non-volatile storage elements in accordance with user data using a program voltage and a first step size for the program voltage; and
the managing circuitry programs non-volatile storage elements of the second subset of non- volatile storage elements in accordance with user data using a program voltage and a second step size for the program voltage, the second step size is larger than the first step size.

17. The non-volatile memory system of claim 4, further comprising:
a first set of select gates adjacent to the second word line; and
a first set of bit lines in communication with the first set of select gates.

18. The non-volatile memory system of claim 7, wherein:
the managing circuitry programs non-volatile storage elements of the first subset of non- volatile storage elements in accordance with user data using a program voltage and a first step size for the program voltage; and
the managing circuitry programs non-volatile storage elements of the second subset of non- volatile storage elements in accordance with user data using a program voltage and a second step size for the program voltage, the second step size is larger than the first step size.

19. The non-volatile memory system of claim 7, further comprising:
a first set of select gates adjacent to the second word line; and
a first set of bit lines in communication with the first set of select gates.

* * * * *